United States Patent [19]
Fluxman et al.

[11] Patent Number: 6,150,865
[45] Date of Patent: Nov. 21, 2000

[54] METHOD FOR THE POSITIONING/ ROUTING OF A GLOBAL CLOCK CIRCUIT ON AN INTEGRATED CIRCUIT, AND ASSOCIATED DEVICES

[75] Inventors: Steven Fluxman, Crolles, France; Trevor Monk, Grande-Bretagne, United Kingdom

[73] Assignee: STMicroelectronics S.A., Gentilly, France

[21] Appl. No.: 09/350,498

[22] Filed: Jul. 9, 1999

[30] Foreign Application Priority Data

Jul. 10, 1998 [FR] France .................................. 98 09008

[51] Int. Cl.[7] .............................................. H03K 19/096
[52] U.S. Cl. ........................... 327/292; 327/295; 327/565
[58] Field of Search .................................... 327/292, 293, 327/295, 564, 565; 326/101; 713/503

[56] References Cited

U.S. PATENT DOCUMENTS

5,744,856   4/1998   Rostoker .................................. 257/618
5,994,777  11/1999   Farrar ..................................... 257/758

*Primary Examiner*—Tuan T. Lam
*Assistant Examiner*—Linh Nguyen
*Attorney, Agent, or Firm*—Theodore E. Galanthay; Allen, Dyer, Doppelt, Milbrath & Gilchrist, P.A.

[57] ABSTRACT

A method for positioning/routing a clock circuit for an integrated circuit compensates for phase differences by adjusting secondary amplifiers having adjustable input delays. The method includes the steps of positioning first conductive lines parallel to a first direction evenly spaced with respect to the second direction. The first conductive lines are connected to outputs of the first amplifiers. A balanced tree-like structure provides each of the first amplifiers a clock signal coming from a single source. The method further includes the steps of positioning functional blocks for forming the integrated circuit, and the positioning of second lines parallel to the second direction. Each secondary amplifier is routed to the closest second line. An equivalent electrical diagram corresponding to the path taken by the clock signal between the input of the tree-like structure device and the input of each secondary amplifier is determined. The analog simulation of the equivalent electrical diagram and the measurement of the phase delays at the input of each secondary amplifier are performed. The input delay of each secondary amplifier is then adjusted to correspond to the largest measured phase delay.

35 Claims, 8 Drawing Sheets

METHOD FOR THE POSITIONING/ ROUTING OF A GLOBAL CLOCK CIRCUIT ON AN INTEGRATED CIRCUIT, AND ASSOCIATED DEVICES

FIELD OF THE INVENTION

The invention relates to integrated circuits, and, more particularly, to a global clock circuit for an integrated circuit.

BACKGROUND OF THE INVENTION

Positioning/routing represents a major effort in designing integrated circuits. A positioning/routing operation positions the different electronic components of an integrated circuit and routes the electrical connections by metal conductors or conductors made of a highly conductive material. For digital circuits, the positioning/routing process may be achieved entirely or partially by using software commonly known as a silicon compiler. The silicon compiler can carry out the entire positioning/routing of an integrated circuit in compliance with the constraints dictated by circuit designers. The silicon compiler also takes into account the positioning algorithms necessary for the software.

The work required for positioning/routing of a global clock circuit primarily lies in making the choices that the machine cannot make or in revising the constraints provided by the software so the machine can carry out the computation. To reduce the computation and development times, a subdivision of the integrated circuit into functional blocks is carried out. These functional blocks are tested individually before being assembled on the integrated circuit. This makes it possible to have complex functional blocks, e.g., a microprocessor core, that are common to several integrated circuits.

The term "large-sized integrated circuit" is defined as an integrated circuit whose dimensions are such that the delay due to the propagation of an electrical signal on a conductive line extending from one side of the integrated circuit to the other is not negligible, particularly when the integrated circuit operates at high frequencies. During the design of an integrated circuit at the functional level, those skilled in the art generally assume that the clock signals reach all the elements of an integrated circuit synchronously. However, to insure efficient operation of the integrated circuit, those skilled in the art must take account of possible phase delays in the clock signal when they carry out a time balance study of the integrated circuit. The propagation times on a conductive line in an integrated circuit primarily depends on three parameters which, for a given technology, are the length of the conductor, the width of the conductor and the number of elements that are connected to this line.

In large-sized integrated circuits, the originally stipulated tolerance value may be erroneous after the routing of the comprehensive or total clock circuit, thus reducing the performance characteristics of the integrated circuit. An increase in the constraints during the routing of the clock circuit may result, in certain cases, in an impossibility of automatic routing because the comprehensive or total clock circuit is the most difficult circuit to route. In certain cases, non-compliance with time-related performance characteristics may make an integrated circuit useless or unusable. These problems of the total distribution of clock signals are known to those skilled in the art who have methods available to cope with them.

A first method includes over-valuing the possible delays. This approach provides circuit designs that are faster than actually needed. This amounts to designing circuits that are over-sized and, therefore, costly. A second method includes achieving maximum control over the delays introduced by the propagation of the clock signal. This second method takes the form of several different techniques for the positioning/routing of the clock signal circuit designed to reduce the phase differences on a clock signal between any two points of an integrated circuit.

Figure 1:
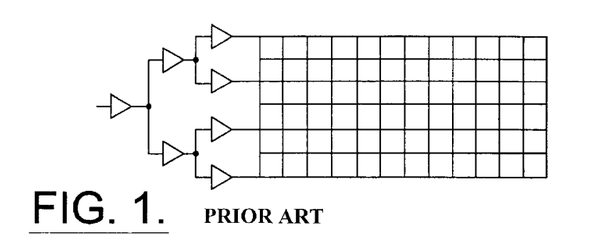
FIGS. 1–4 respectively show a schematic view of a clock circuit, according to the prior art.

A first technique is shown in FIG. 1. This first technique includes making a metal grid to distribute the clock signal throughout the circuit. The metal grid has a first effect which is to make the capacitance values due to the elements that receive the clock signal negligible as compared with the parasitic capacitance of the grid. A second effect produced by this metal grid is to reduce the resistance of the conductors which distribute the clock signal. The combination of these first and second effects is that there is a small phase difference throughout the circuit.

However, the metal grid has two drawbacks. A first drawback is related to its grid structure which uses an entire layer of metal, or a very large part of the metal layer, thus rendering the layer of metal unusable for making other connections. A second drawback is related to the compensation of the phase differences which tends to considerably increase the parasitic capacitance of the metal grid since the parasitic capacitance is dependent upon the surface area of the integrated circuit. This substantial parasitic capacitance prompts high power consumption by the integrated circuit.

Figure 2:
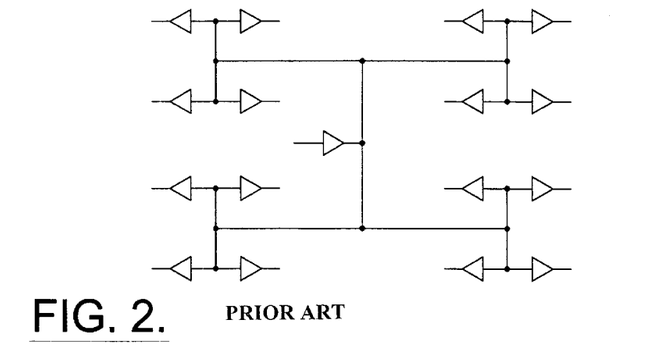

A second technique is shown in FIG. 2. This second technique includes positioning identical clock signal amplifiers throughout the surface of the integrated circuit. These identical clock signal amplifiers receive all the clock signals by a tree-like distribution network such that all the clock signal amplifiers receive the clock signal with the same delay. Each clock signal amplifier then distributes the signal on a small surface of the integrated circuit in which the propagation times on the conductive lines are considered to be negligible. Each clock signal amplifier has an output stage proportional to the number of elements that are connected thereto.

A first drawback of this second technique is the need to position all the clock signal amplifiers on the integrated circuit before positioning the other elements of the integrated circuit. A second drawback arises out of the elimination of one or more clock signal amplifiers that are unnecessary and/or inconvenient. As a result, for example, the tree-like structure is unbalanced and the clock signal amplifiers no longer receive the clock signal in phase.

Figure 3:
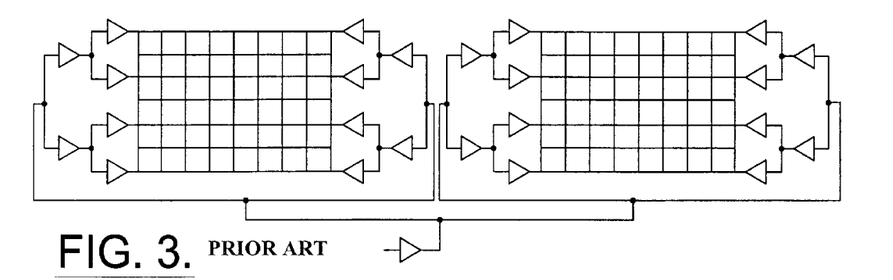

A third technique, shown in FIG. 3, combines the above two techniques. The surface of the integrated circuit is divided into several small surfaces of identical dimensions, with each small surface being covered with a metal grid. The metal grids are then connected to a clock distribution network with a tree-like structure. This enables a reduction of the consumption of the metal grids which, since they are smaller-sized, can use finer conductors and thus reduce the parasitic capacitance of each grid. Furthermore, if a zone of the integrated circuit does not need a clock signal, the metal grids may be eliminated. As compared with the second technique, the clock signal amplifiers are positioned between the different locations of the grids providing flexibility to position the other elements of the integrated circuit. Although reduced, the drawbacks of the first and second techniques are still present.

Figure 4:
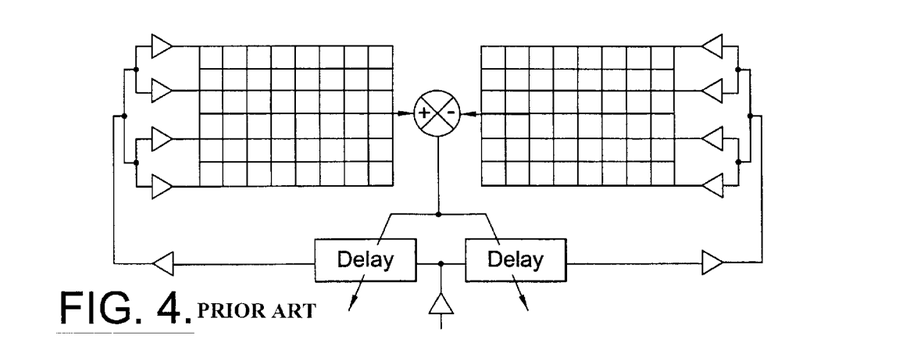

A fourth technique, shown in FIG. 4, includes achieving a dynamic compensation for the delays on the clock signal on the basis of measurement points. This fourth technique can be combined with the second and third techniques and enables a partial rebalancing of a tree-like structure. However, the compensation only shifts the phase imbalance and cannot totally compensate for it.

SUMMARY OF THE INVENTION

An object of the present invention is to provide a technique for the positioning/routing of a clock circuit for an entire integrated circuit while reducing the constraints for positioning other elements on the integrated circuit, while at the same time obtaining efficient control over the phase of the clock signal throughout the entire integrated circuit. The clock circuit is to have low power consumption.

Another object of the present invention is to provide a method for positioning/routing of a clock signal on an integrated circuit whose surface extends along first and second directions that are distinct from each other. The method includes the steps of positioning first conductive lines parallel to the first direction which are evenly spaced out in the second direction. The first conductive lines are connected on at least one end to outputs of first amplifiers. A balanced tree-like structure device provides at each of the first amplifiers a clock signal coming from a single source.

The method further includes the steps of positioning functional blocks for forming the integrated circuit, and the positioning of second conductive lines parallel to the second direction. Each second conductive line is associated with a functional block. Secondary amplifiers are positioned in each functional block as a function of the requirements of each functional block. Each secondary amplifier has an adjustable delay device at the input, and each secondary amplifier is routed to the closest second conductive line. An equivalent electrical diagram corresponding to the path taken by the clock signal between the input of the tree-like structure device and the input of each secondary amplifier is determined. The analog simulation of the equivalent electrical diagram and the measurement of the phase delays at the input of each secondary amplifier are performed. The input delay of each secondary amplifier is adjusted to correspond to the largest measured phase delay.

Yet another object of the present invention is to provide a clock signal amplifier for implementation of the clock circuit positioning technique. The clock signal amplifier includes an input stage and an output stage. The input stage includes an input inverter that receives the clock signal at its input, and at least one adjustment capacitor connected to the output of the input inverter.

The present invention also relates to an integrated circuit having a clock circuit that includes at least one clock circuit amplifier in which the input stage includes an input inverter that receives the clock signal, and at least one adjustment capacitor connected to the output of the input inverter. Furthermore, the clock circuit includes at least one partially balanced tree-like structure that provides a clock signal to a series of first amplifiers, and a structure of non-balanced connections that connects the outputs of the first amplifier to at least one clock signal amplifier.

BRIEF DESCRIPTION OF THE DRAWINGS

The invention will be understood more clearly and other particular features and advantages shall appear from the following description, made with reference to the appended drawings, of which.

DETAILED DESCRIPTION OF THE PREFERRED EMBODIMENTS

FIGS. 5 to 9 show an integrated circuit 1 at different steps in the design of a clock circuit for the total distribution of clock signals. These figures do not show the other elements in the integrated circuit 1 so as not to excessively burden the figures, nor are these figures drawn to scale. The method of positioning/routing that shall be described hereinafter may be carried out under the direct supervision of one skilled in the art, or automatically by a computer programmed according to the method described herein.

Figure 5:
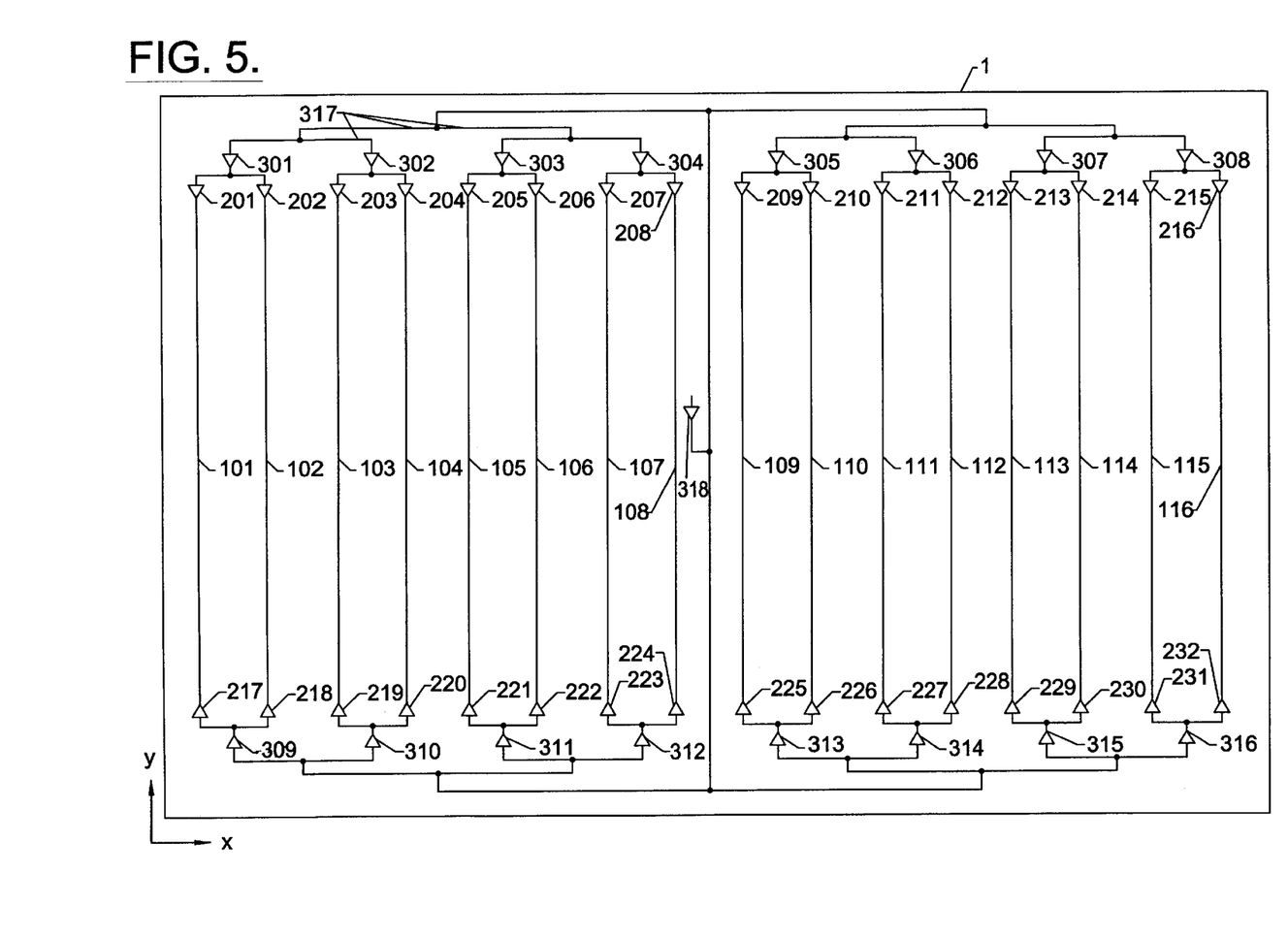
FIGS. 5–9 respectively show a schematic view of the positioning/routing of a comprehensive clock circuit on an integrated circuit, according to the present invention.

The surface of the integrated circuit 1 is oriented in two directions X and Y that are distinct from each other. These directions are, for example, perpendicular to each other but this is not required. FIG. 5 shows the integrated circuit 1 after the positioning of the general distribution network. To obtain this network, the following steps are performed in any order after the evaluation of the total surface area of the integrated circuit 1:

Step E1: First conductive lines 101–116 are positioned parallel to the first direction Y and are evenly spaced out along the second direction X. The first lines 101–116 extend throughout the active width of the integrated circuit 1.

Step E2: First amplifiers 201–232 are positioned at each end of each first line 101–116. These first amplifiers 201–232 are used to supply the clock signal to the first lines 101–116. These first amplifiers 201–232 are of a known type. For example, the first amplifiers 201–232 are two series-connected inverters.

Step E3: A device with a tree-like structure is positioned to give each of the first amplifiers the clock signal coming from a single source. The tree-like structure, in the example described, comprises second amplifiers 301–316 whose inputs are all connected together by a conductor 317 with a tree-like structure. The conductor is furthermore connected to the output of a central amplifier 318. The input of the central amplifier is connected either to an internal clock signal generator or to a terminal of the integrated circuit 1, possibly by a phase lock loop.

The tree-like structure 317 is organized such that the path traveled by a signal between the output of the central amplifier 318 and the input of any of the second amplifiers 301–316 is identical. Each second amplifier 301–316 has its output connected to two of the first amplifiers 201–232. Thus, the first lines 101–116 receive the clock signal synchronously from a balanced tree. It is also possible for the tree-like structure 317 to comprise additional conventional type amplifiers at each branching to reduce the size of the central amplifier 318. In this case, the additional amplifiers must be positioned in a balanced manner.

The first lines 101–116 distribute the clock signal throughout the integrated circuit 1. However, these first lines 101–116 are far more spaced out and may be thinner than in the case of a prior art metal grid. For example, in 0.35 μm CMOS technology the lines are spaced out at about 1 mm and have a width of 2 μm for a 16 mm×12 mm circuit. To more easily obtain a balanced tree, it is sought to have a number of first lines equal to a power of two and spaced out, for example, at distances of 0.8 to 1.5 mm.

Those skilled in the art may observe that the use of the first lines 101–116 has the effect of prompting a phase delay in the middle of each line that is greater than it is at the ends. Preferably, these first lines are positioned at the same level of metal as the conductive lines supplying the integrated circuit 1, i.e., VCC and ground. Positioning the first lines 101–102 between the supply conductors advantageously brings about an electromagnetic sheathing of the first lines. It may be sufficient for smaller-sized circuits to use only one first amplifier per each first line. The tree-like structure may then be halved. The delay in propagation of the clock signal is then the maximum between the two ends of each first line.

Figure 6:
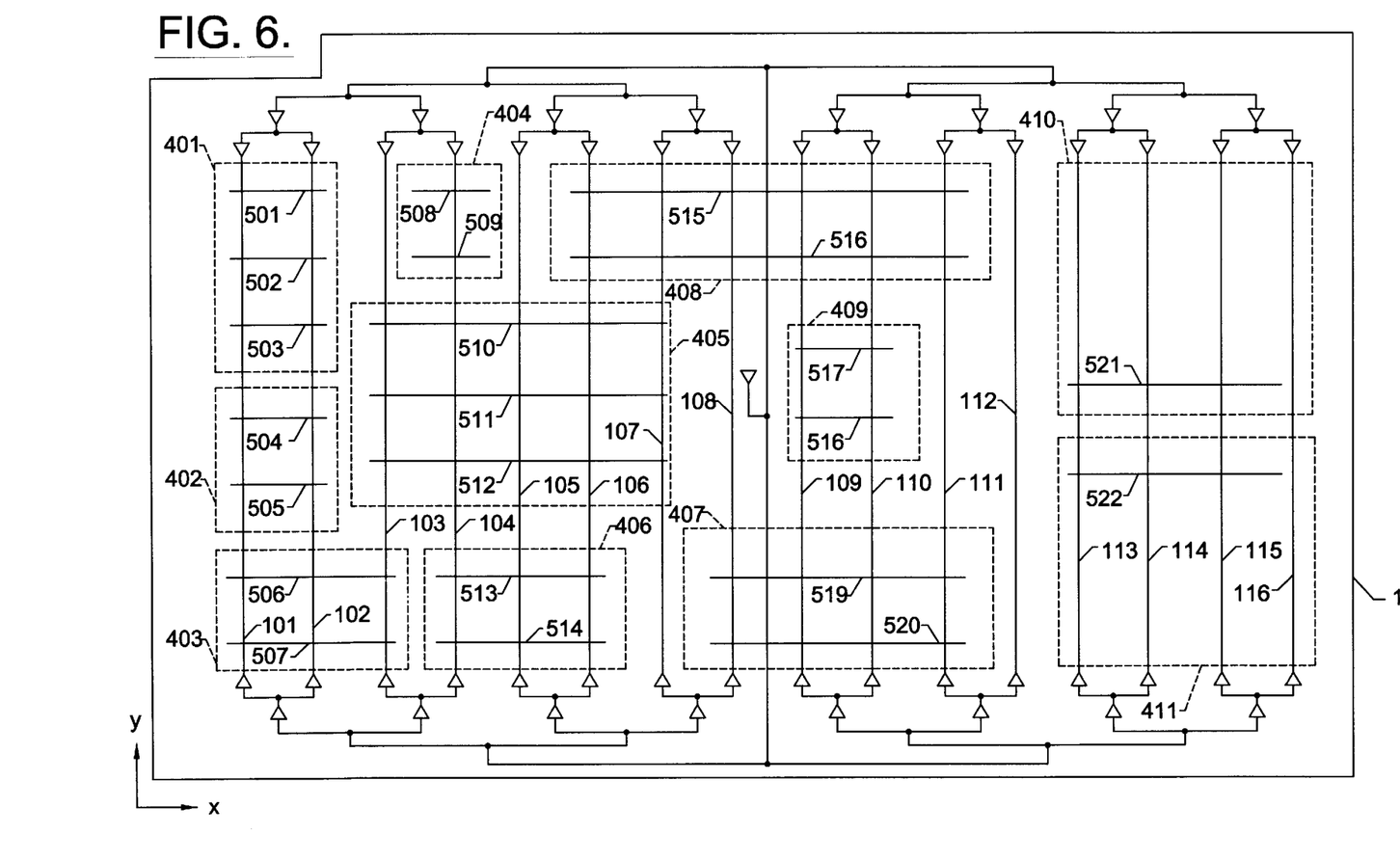

FIG. 6 shows the integrated circuit 1 after the positioning of the functional blocks. To obtain this state of progress, the following steps are performed in any order:

Step E4: The size of the different functional blocks 401–411 forming the integrated circuit 1 is assessed, and then the blocks 401–411 are positioned while taking account of the communication buses that have to connect the different blocks 401–411.

Step E5: Second lines 501–522 are positioned parallel to the second direction X, each second line 501–522 is associated with a block 401–411.

The size of each block 401–411 can be evaluated according to a known method. This is also the case for the positioning of the blocks on the integrated circuit. The positioning of the second lines 501–522 can be done according to different methods depending on different arbitrary choices, and according to the function of the different blocks 401–411.

A first method, for example, for the block 408 includes centering the second lines 515 and 516 with respect to the central axis of the block that is parallel to the second direction X and evenly spaced out along the first direction Y. The spacing between the second lines 515 and 516 must comply with conditions substantially equivalent to the conditions of spacing of the first lines 101–116, but entirely within the block 408 with which they are associated. The second lines 515 and 516 extend throughout the length of the block 408 concerned, but stop at a distance less than half the distance of separation between two first lines. It is also possible for the second lines 510–512 to extend on either side of the block 405.

If, on the contrary, it is known that a block 410 is a memory, for example, then we may be satisfied with positioning a single second line 521 in this block 410 in a region of the block corresponding to the control circuit of the memory. The criteria of the positioning and spacing of the second lines 501–522 may obviously vary between distinct blocks. Any combination may be considered. Preferably, the positioning of the second lines 501–522 can be done on a metal layer different from the metal layer used for the first lines 101–116.

Figure 7:
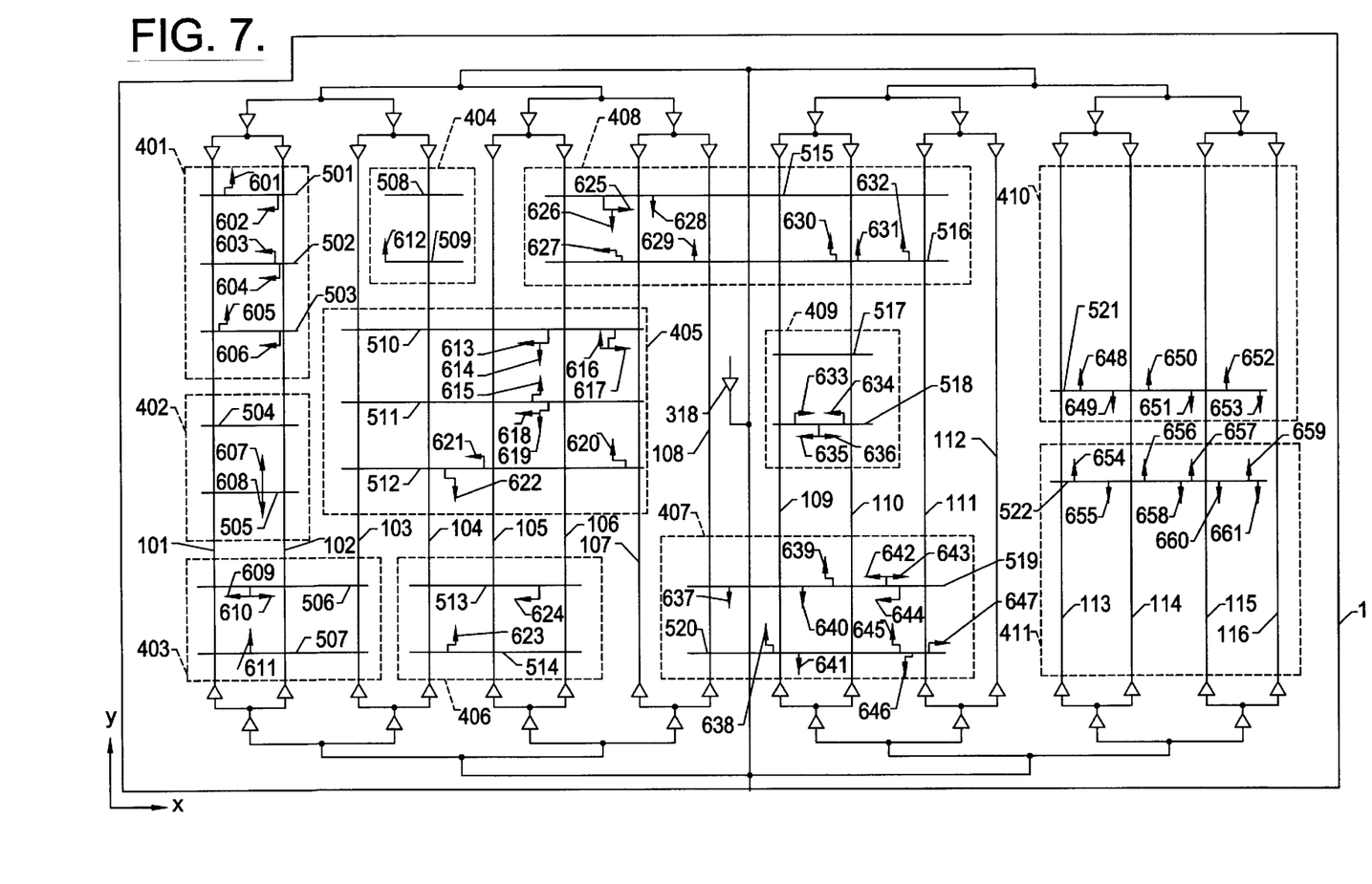

FIG. 7 shows the integrated circuit 1 after the internal positioning/routing of the functional blocks. To obtain this state of progress, the following steps have been performed in any order:

Step E6: Secondary amplifiers 601–661 are positioned in each block 401–411 as a function of the requirements of each of the blocks 401–411. A preferred method of positioning blocks 401–411 will be described in detail below with reference to FIGS. 10–12. Each secondary amplifier 601–661 has an adjustable delay device at its input that will be described in detail with reference to FIG. 14.

Step E7: The routing of each secondary amplifier 601–661 to the closest second line 501–522 is done. The trace of the connections within each block 401–411 is made after the positioning of the different elements of each block 401–411. It is possible to slightly modify the positioning of the blocks if the routing proves to be impossible, as will be known by one skilled in the art.

In one example, FIG. 7 corresponds to a finished circuit. However, in order that the circuit may be completely finished, it is necessary to make the adjustment of the clock circuit as indicated in the following steps:

Step E8: An equivalent electrical drawing corresponding to the route of the clock signal between the input of the device with the tree-like structure and the input of each secondary amplifier is determined. The determination of a circuit of this kind is done automatically by modeling all the transistors and all the conductors of the circuit on the basis of the output model of the central amplifier 318 up to the input model of the secondary amplifiers 601–661.

Step E9: The analog simulation of the equivalent electrical diagram is done and phase delays are measured at the input of each secondary amplifier 601–661. During the measurement of the phase delays, the largest phase delay is determined.

Step E10: The input delay of each secondary amplifier 601–661 is adjusted to correspond to the largest measured phase delay. The adjustment is done by adding a delay to the input of each secondary amplifier 601–661. The added delay is equal to the difference in delay between the largest delay and the delay measured for the concerned amplifier. To avoid having to redo the positioning of the elements, it is appropriate during the positioning of the secondary amplifiers to set aside a sufficient surface area that corresponds to the surface area needed to obtain a maximum delay.

Figure 8:
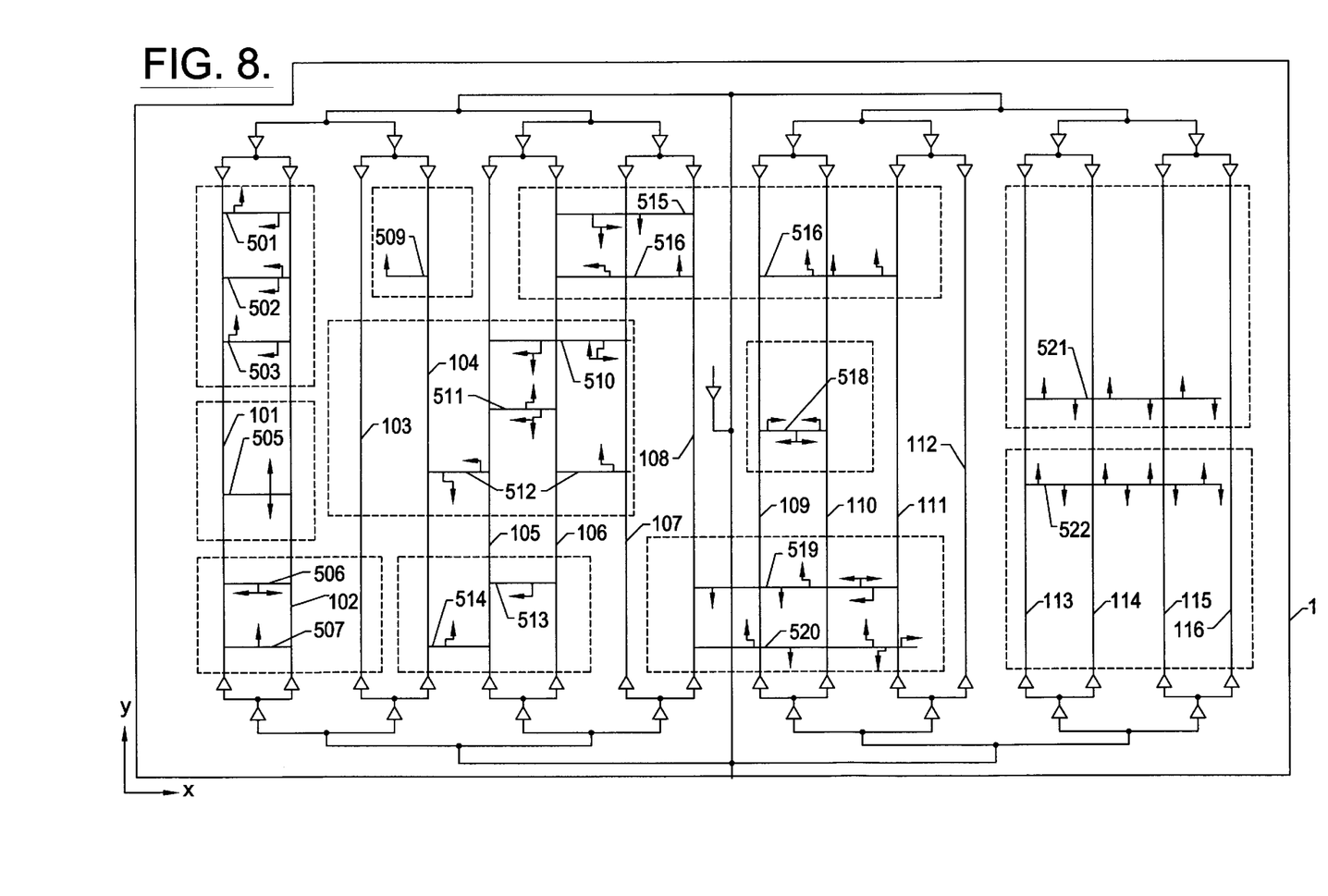
Figure 9:
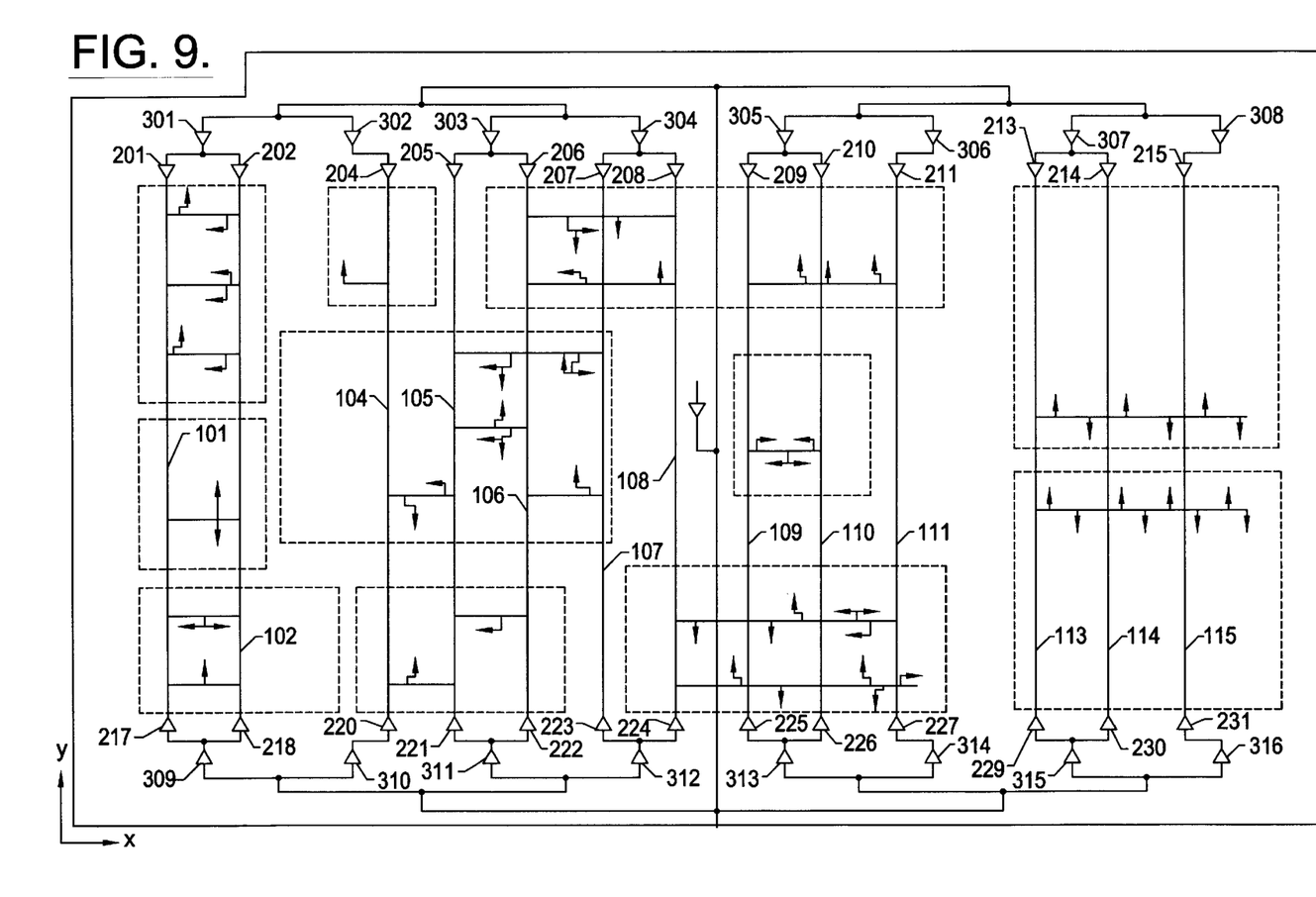

FIGS. 8 and 9 show improvements in the clock circuit of FIG. 7. FIG. 7 shows that certain second lines 504, 508, 515 and 517 are not used. Similarly, the other second lines, e.g., 510, include parts located between two successive first lines, e.g., 103 and 104 which are not used. These second partially or totally unused second lines form parasitic capacitances that increase the power consumption of the integrated circuit.

In FIG. 8, all the portions of the second lines 501–522 that are located between two first successive lines are eliminated if there is no secondary amplifier connected to these portions. This means eliminating the unused second lines as well as the pieces of unnecessary second lines that create superfluous parasitic capacitances. This elimination must be done before performing the determination of the equivalent diagram of step E10.

FIG. 9 shows the integrated circuit 1 which is even more optimized with respect to power consumption. In FIG. 9, the first lines 103, 112 and 116 which are not connected to at least one secondary amplifier have been eliminated. This elimination is done before determining the equivalent electrical diagram of step E10. The elimination of the first lines may also be done independently of the elimination of the second lines.

Again, with the same goal of reducing power consumption, the first amplifiers 203, 212, 216, 219, 228 and 232 connected to the first lines 103, 112 and 116 that have been eliminated are also eliminated. The elimination of the first amplifiers 203, 212, 216, 219, 228 and 232 prompts an imbalance on the first amplifiers 204, 211, 215, 220, 227 and 231 connected to the same second amplifiers 302, 306, 308, 310, 314 and 316. The imbalance thus created may be corrected by the input delay of the secondary amplifiers. However, if it is desired to prevent a variation of delay that is too large to be corrected, then it is not necessary to eliminate the first amplifiers. It is preferable not to eliminate any second amplifier that would completely unbalance the tree-like structure to a substantial degree which would be less easily coompensated.

To reduce the corrections of delay at the inputs of the secondary amplifiers, it is possible to obtain an anticipated compensation on the first amplifiers. For this purpose, each of the first amplifiers is sized, before determining the equivalent diagram, as a function of the surface area of the first and second lines connected to the output of the first amplifiers. This compensation may be done from the time when the second lines are positioned. The total surface of the first and second lines defines a frame of resistors and parasitic capacitors whose equivalent module perceived by the output of each first amplifier is different. It is enough to determine the equivalent load for each first amplifier and size the output stage of each first amplifier as a function of its equivalent load.

At the level of the delay compensation achieved at each secondary amplifier, the determination of the equivalent diagram does not take account of the differences in supply voltage at the integrated circuit. For the large-sized integrated circuits, the supply voltage also depends on the distance from the edge of the closest integrated circuit. It is not possible to obtain voltage compensation for this phenomenon which is due to the electrical consumption by the integrated circuit. The low supply voltage circuits are particularly sensitive to this phenomenon.

Thus, for the low supply voltage circuits, it is preferable that the delays of the secondary amplifiers should also be adjusted as a function of the distance between the position of each secondary amplifier and the closest edge of the integrated circuit. The delay to be added may be given by a second degree X and Y polynomial whose different coefficients depend on a very large number of parameters that are determined by the gradient of supply voltage of the chip. The position on the integrated circuit 1 of the amplifier to be compensated for are x and y.

Figure 10:
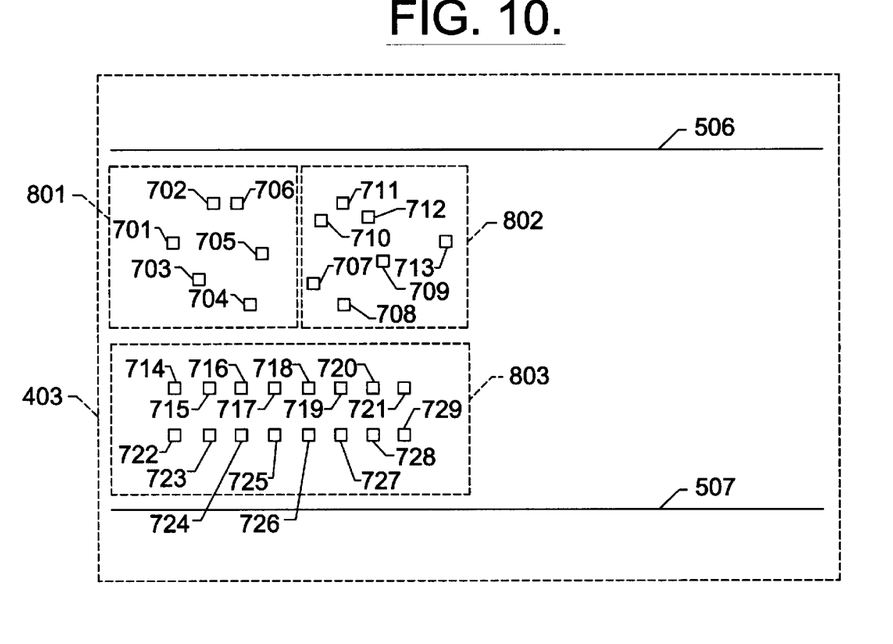
FIGS. 10–12 respectively show a schematic view of the positioning/routing of a clock circuit within a functional block of an integrated circuit, according to the present invention.
Figure 11:
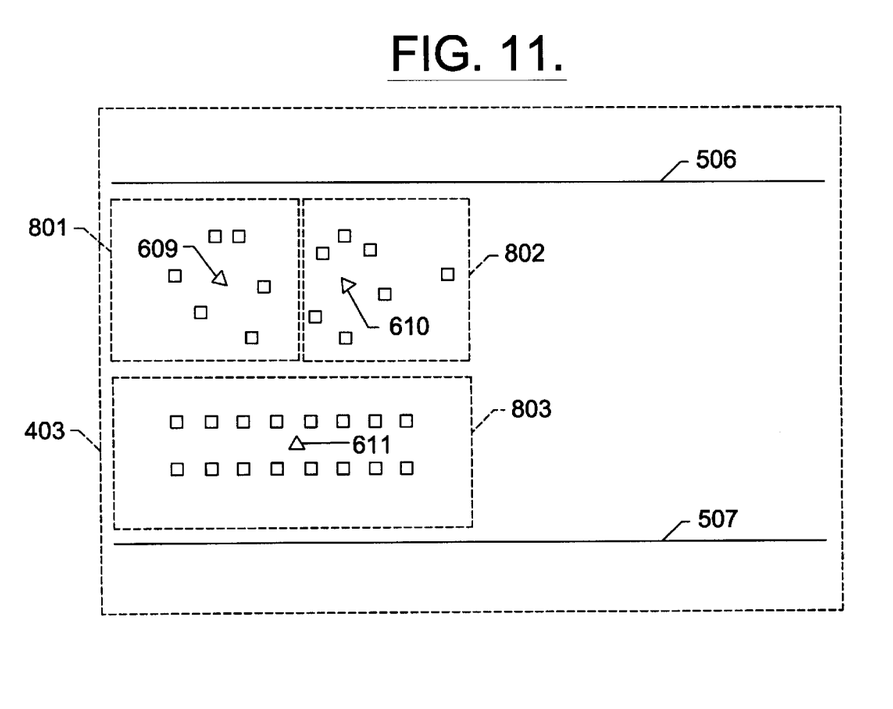
Figure 12:
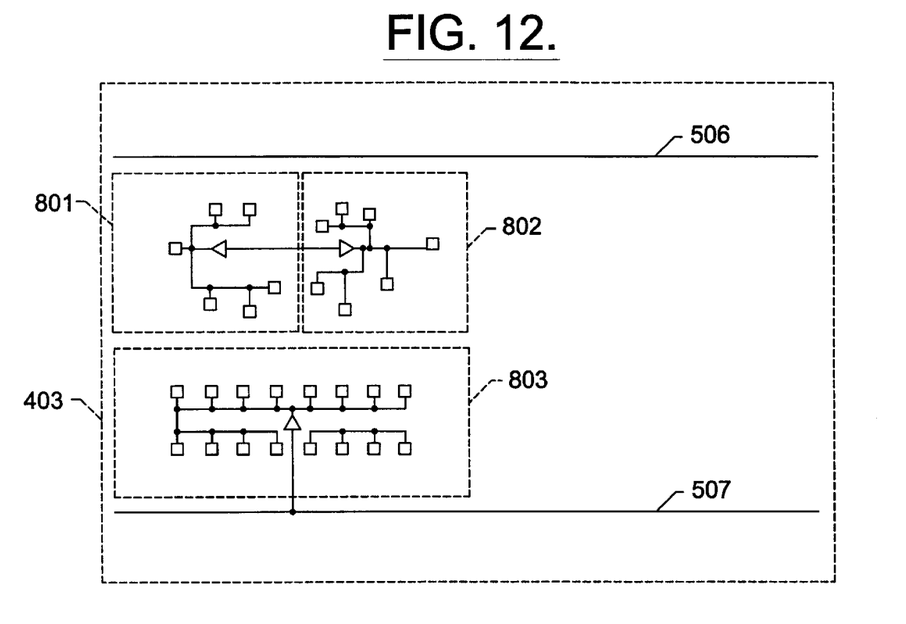

FIGS. 10–12 show a block 403 according to a preferred embodiment of the steps E6 and E7 described above. These figures show only those elements that are needed for understanding the present invention. Similarly, these figures are not drawn to scale.

FIG. 6 shows the block 403 in which the second lines 506 and 507 have been positioned beforehand. All the components of the block 403 are positioned according to a known method. These components are elementary structures 701–729 requiring the clock signal. The term "elementary structures" 701–729 is understood to mean synchronous flip-flop circuits having a single clock signal input.

After this first positioning, the elementary structures 701–729 are brought together by proximity groups 801–803. Each group 801–803 has a number of elementary structures 701–729 that is smaller than or equal to a maximum number, e.g., 16, and are extended over a surface area smaller than or equal to a maximum surface area, e.g., 0.25 mm². The maximum surface is defined as a function of the technology used. The term "maximum surface area" is understood to mean an elementary surface, e.g., a square, whose dimensions are such that it may be assumed that the propagation time between any two points of the maximum surface is negligible.

The maximum number of elementary structures is defined as being the number of structures that may be connected to the secondary amplifier without changing the timing transfer characteristics of the secondary amplifiers. Preferably, the invention uses secondary amplifiers whose output transistors are sized as a function of the number of elements that will be connected to the output. Each secondary amplifier operates in a range permitting a minimum number and a maximum number of connections. The maximum number then becomes equal to the greatest maximum number of the range permitting the greatest number of connections.

Several possibilities of implementation are possible and are equivalent. For example, it is possible to carry out the following steps:

Step F1: The counting of the number of elementary structures.

Step F2: The division of the number of elementary structures by the maximum number to obtain a number of groups.

Step F3: The successive testing of all the positions of a number of square surfaces of maximum size equal to the number of groups until a positioning is achieved that can be used to encompass all the elementary structures, or until all the possibilities of positioning have been tried.

Step F4: If all the possibilities of positioning have been tried without success, then the number of groups is incremented by 1 and the step F3 is repeated. In a preferred variation, a balancing of the groups is done. It is enough, for example, to replace the step F3 by the following step F'3 or to add the following step F5 after the step F4:

Step F'3: A successive test is made of all the positions of a number of square surfaces of maximum size equal to the number of groups, and all the positionings that enable the covering of all the elementary structures are memorized until all the possibilities of positioning have been tried.

Step F5: For each positioning memorized, the standard mean deviation is computed with respect to the mean of the number of elementary structures per group, and then the group positioning with the smallest mean standard deviation is chosen.

Those skilled in the art could apply one of the many other known positioning algorithms to carry out this positioning. It is also possible to verify the efficient operation of the amplifiers after routing and, if necessary, use an amplifier of the higher range if the routing paths are very large.

After the making of the groups 801–803, a secondary amplifier 609–611 is positioned within each group 801–803 as shown in FIG. 11. During the positioning of the secondary amplifiers 609–611, the elements of the block 403 are not taken into account except for the elementary structures 701–729. Preferably, the secondary amplifiers 609–611 are positioned close to the center of the elementary structures of their groups 701–729 to reduce the delays. After the secondary amplifiers 609–611 have been positioned, a new positioning of a part of the elements of the block 403 is carried out in permitting only a small shift, e.g., a few tens of μm for a device made by 0.35 μm CMOS technology, for the secondary amplifiers 609–611 and for the elementary structures 701–729.

The following step shown in FIG. 12 is that of the routing of the elements of the block 403. Only the links conveying the clock signal have been shown in order to simplify FIG.

12. The routing is done comprehensively in the block 403, namely in taking account of all the connections to be made. The connections made within each group 801–803 are, in most cases, relatively short and have a minor influence on the phase differences at the input of each elementary structure. This is because they are within surfaces whose size has been chosen so that the propagation times on the connection wires are negligible.

Figure 13:
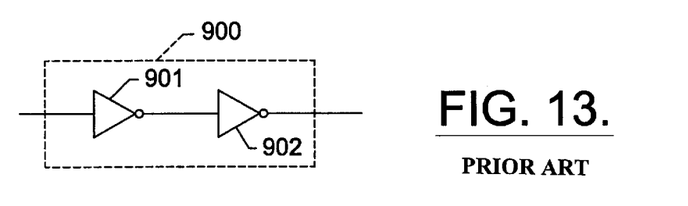
FIG. 13 shows a standard type clock signal amplifier, according to the prior art.

FIG. 13 shows a clock signal amplifier 900 well known to those skilled in the art. The clock signal amplifier 900 is formed by first and second inverters 901 and 902 that are series-connected. The first inverter 901 has its output connected to the input of the second inverter 902. Conventionally, the first inverter 901 is limited in size and the transistors that form it are of a size close to the minimum size permitted by the technology. The second inverter 902 is a larger size. The transistors that form the second inverter 902 are sized as a function of the load connected to the output.

There are many variations of clock signal amplifiers using an even or odd number of inverters depending on whether the amplifier is a non-inverting or inverting amplifier. The principle is to have an input inverter of limited size and an output inverter whose size is appropriate to the load. The number of inverters used depends on the differences in sizes possible for the output inverter to dampen the variation on several inverters and have similar propagation times between two clock signal amplifiers.

Figure 14:
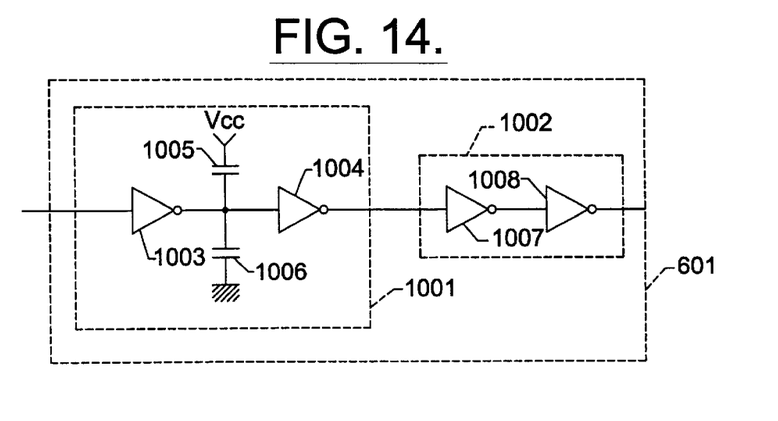
FIG. 14 shows a clock signal amplifier, according to the present invention.

In the present invention, the first and second amplifiers 201–216 and 301–308 are of the same type as the clock signal amplifier 900 of FIG. 13. In contrast, the secondary amplifiers 601–661 are a particular type of clock signal amplifier and are shown in FIG. 14. The secondary amplifier 601 has an input stage 1001 and an output stage 1002 that are series-connected.

The input stage has an input inverter 1003, a buffer inverter 1004 and first and second adjusting capacitors 1005 and 1006 connected to the output of the input inverter. The input inverter 1003 receives the clock signal at its input. The buffer inverter 1004 has its input connected to the output of the input inverter 1003. The first capacitor 1005 has a first terminal connected to the output of the input inverter 1003 and a second terminal receiving the supply voltage Vcc. The second capacitor 1006 has a first terminal connected to the output of the input inverter 1003 and a second terminal connected to the ground.

The input stage 1001 makes it possible to have a delay that is variable as a function of the size of the first and second capacitors 1005 and 1006. For this purpose, it is appropriate to make the input amplifier 1003 and the buffer amplifier 1004 with transistors having a size close to the minimum size permitted by the technology used.

As is known to those skilled in the art, the propagation time between the input inverter 1003 and the buffer inverter 1004 is proportional to the size of the input inverter and to the capacitive load connected to the output of this very same input inverter 1003. At a constant inverter size, if the capacitor at the output of the input inverter 1003 is increased, then the propagation time between the input inverter 1003 and the buffer inverter 1004 is increased proportionally. Only one capacitor will be enough to produce an additional delay. Nevertheless, it is appropriate to balance the capacitive load between Vcc and ground to have a capacitive bridge between Vcc and ground that corresponds to the threshold voltage of the buffer inverter 1004.

The output stage 1002 has two output inverters 1007 and 1008 that are series-connected. The use of two inverters instead of one makes it possible to have a wider range of sizes of the secondary amplifier 601. If it is desired, for example, to have 1 to 16 elementary structures supplied by the secondary amplifier 601 with a difference in propagation time that is negligible regardless the number of structures, then it is necessary to have an output inverter 1008 whose size varies approximately from 1 to 8.

So as not to have a variation in a capacitive load ranging from 1 to 8 on the output of the buffer inverter 1004 that would result in a major variation, it is necessary to have an intermediate inverter 1007 for which the size of the transistors varies in a ratio of 1 to 2 to have a smaller time-related effect. To further reduce the time-related effects, or have a larger range, it is possible to add other inverters in the output stage.

In one variantion, one of the inverters 1003, 1004, 1007 or 1008 is replaced by a logic gate, for example, a NAND or NOR logic gate. One of the inputs of the logic gate is substituted for the input of the inverter that is replaced. The other input or the other inputs of the logic gate are used to validate the clock signal. This enables the partial stopping of the clock on a part of the circuit to reduce power consumption.

Many variants of the invention are possible. In particular, the numerical information presented herein may be replaced by other values by matching the numerical values to the integrated circuit in which the invention is implemented. The numerical values also must be adapted as a function of the time-related tolerance values set by those skilled in the art when mraking the integrated circuit. In addition to the invention being used for large-sized integrated circuits operating at high frequency, the invention can also be applied to smaller-sized circuits operating at lower frequencies which require great precision for synchronizing of the clock signal.

That which is claimed is:

1. A method for positioning/routing a global clock circuit on an integrated circuit, the method comprising the steps of:
   positioning a plurality of first conductive lines on the integrated circuit parallel to a first direction, each first conductive line being connected to at least one first amplifier having an input receiving a clock signal, the clock signal originating from a single source for forming a balanced tree-like structure with the at least one first amplifier;
   positioning functional blocks forming the integrated circuit and positioning a plurality of second conductive lines on the integrated circuit parallel to a second direction, each second conductive line connected to a functional block;
   positioning in each functional block at least one second amplifier having an adjustable input delay, and routing a closest one of the plurality of second conductive lines to each second amplifier;
   determining an equivalent electrical diagram corresponding to a clock signal path between an input of the tree-like structure and an input of each second amplifier;
   simulating the equivalent electrical diagram and measuring a phase delay at the input of each second amplifier; and
   adjusting the input delay of each second amplifier to correspond to a largest measured phase delay.

2. A method according to claim 1, further comprising the steps of:
   positioning a plurality of devices in each functional block for receiving the clock signal;

arranging the plurality of devices by proximity group, each proximity groups having at least one device less than or equal to a maximum number and being positioned over a surface area less than or equal to a maximum surface area; and positioning each second amplifier within a respective proximity group.

3. A method according to claim 2, further comprising the step of balancing the proximity groups with respect to a surface area of a corresponding functional block.

4. A method according to claim 2, wherein each second amplifier comprises an output transistor; the method further comprising the step of sizing each output transistor as a function of the at least one device within each corresponding proximity group.

5. A method according to claim 2, wherein the step of positioning each second amplifier comprises positioning each second amplifier in a center of the respective proximity group.

6. A method according to claim 1, further comprising the step of eliminating first conductive lines not connected to at least one second amplifier before determining the equivalent electrical diagram.

7. A method according to claim 6, further comprising the step of eliminating first amplifiers connected to the first conductive lines being eliminated.

8. A method according to claim 1, further comprising the step of eliminating portions of the second conductive lines located between two first conductive lines when there is no second amplifier connected to these portions.

9. A method according to claim 1, wherein the step of positioning the plurality of first conductive lines comprises placing the plurality of first conductive lines on a layer of the integrated circuit corresponding to a layer used to supply the clock signal.

10. A method according to claim 1, wherein the step of adjusting comprises adjusting as a function of a distance between each second amplifier and a closest edge of the integrated circuit.

11. A method according to claim 1, wherein the step of positioning the plurality of first and second conductive lines comprises positioning the plurality of first and second conductive lines on respective first and second layers of the integrated circuit.

12. A method according to claim 1, further comprising sizing each first amplifier as a function of a surface area of the plurality of first and second conductive lines connected to the output of a corresponding second amplifier.

13. A method according to claim 1, wherein each second amplifier comprises:

an input stage comprising an input inverter receiving the clock signal, and at least one adjustment capacitor connected to an output of the input inverter producing a delay; and an output stage connected to the at least one adjustment capacitor.

14. A method for positioning/routing a global clock circuit on an integrated circuit, the method comprising the steps of:

positioning a plurality of first conductive lines on the integrated circuit in a first direction, each first conductive line being connected to at least one first amplifier having an input receiving a clock signal;

positioning functional blocks forming the integrated circuit and positioning a plurality of second conductive lines on the integrated circuit parallel to a second direction, each second conductive line connected to a functional block;

positioning in each functional block at least one second amplifier having an adjustable input delay, and routing one of the plurality of second conductive lines to each second amplifier;

determining an equivalent electrical diagram corresponding to a clock signal path originating from a source and an input of each second amplifier;

simulating the equivalent electrical diagram and measuring a phase delay at the input of each second amplifier; and adjusting the input delay of each second amplifier to correspond to a largest measured phase delay.

15. A method according to claim 14, wherein the clock signal path originating from a single source forms a balanced tree-like structure with the at least one first amplifier.

16. A method according to claim 14, further comprising the steps of:

positioning a plurality of devices in each functional block for receiving the clock signal;

arranging the plurality of devices by proximity groups, each proximity group having at least one device less than or equal to a maximum number and being positioned over a surface area less than or equal to a maximum surface area; and positioning each second amplifier within a respective proximity group.

17. A method according to claim 16, further comprising the step of balancing the proximity groups with respect to a surface area of a corresponding functional block.

18. A method according to claim 16, wherein each second amplifier comprises an output transistor; the method further comprising the step of sizing each output transistor as a function of the at least one device within each corresponding proximity group.

19. A method according to claim 16, wherein the step of positioning each second amplifier comprises positioning each second amplifier in a center of the respective proximity group.

20. A method according to claim 16, further comprising the step of eliminating first conductive lines not connected to at least one second amplifier before determining the equivalent electrical diagram.

21. A method according to claim 14, further comprising the step of eliminating first amplifiers connected to the first conductive lines being eliminated.

22. A method according to claim 14, further comprising the step of eliminating portions of the second conductive lines located between two first conductive lines when there is no second amplifier connected to these portions.

23. A method according to claim 14, wherein the step of positioning the plurality of first conductive lines comprises placing the plurality of first conductive lines on a layer of the integrated circuit corresponding to a layer used to supply the clock signal.

24. A method according to claim 14, wherein the step of adjusting comprises adjusting as a function of a distance between each second amplifier and a closest edge of the integrated circuit.

25. A method according to claim 14, wherein the step of positioning the plurality of first and second conductive lines comprises positioning the plurality of first and second conductive lines on respective first and second layers of the integrated circuit.

26. A method according to claim 14, further comprising sizing each first amplifier as a function of a surface area of the plurality of first and second conductive lines connected to the output of a corresponding second amplifier.

27. A method according to claim 14, wherein each second amplifier comprises:

an input stage comprising an input inverter receiving the clock signal, and at least one adjustment capacitor connected to an output of the input inverter producing a delay; and an output stage connected to the at least one adjustment capacitor.

28. An integrated circuit comprising:

a plurality of functional blocks;

a global clock circuit connected to said plurality of functional blocks providing a clock signal, said global clock circuit comprising a plurality of first amplifiers having an input receiving the clock signal, the clock signal originating from a source and forming a balanced tree-like structure with said plurality of first amplifiers, a plurality of first conductive lines parallel to a first direction, each first conductive line being connected to at least one of said plurality of first amplifiers, and a plurality of second conductive lines parallel to a second direction, each second conductive line being connected to at least one of said plurality of functional blocks; and each functional block comprising at least one second amplifier having an adjustable input delay connected to a closest one of said plurality of second conductive lines, the adjustable input delay being adjusted to correspond to a largest phase delay between the source clock signal and respective inputs of said plurality of second amplifiers.

29. An integrated circuit according to claim 28, wherein each one of said plurality of functional blocks comprises a plurality of devices receiving the clock signal.

30. An integrated circuit according to claim 29, wherein said plurality of devices are arranged by proximity groups, and wherein each proximity group has at least one device less than or equal to a maximum number and is positioned over a surface area less than or equal to a maximum surface area.

31. An integrated circuit according to claim 30, wherein each second amplifier is positioned within a respective proximity group.

32. An integrated circuit according to claim 31, wherein said proximity groups are balanced with respect to a surface area of a corresponding functional block.

33. An integrated circuit according to claim 28, wherein said plurality of first conductive lines are on a first layer corresponding to a layer providing the clock signal.

34. An integrated circuit according to claim 28, wherein said plurality of first and second conductive lines are on respective first and second layers.

35. An integrated circuit according to claim 28, wherein each one of said plurality of second amplifiers comprises:

an input stage comprising an input inverter receiving the clock signal, and at least one adjustment capacitor connected to an output of said input inverter producing a delay; and an output stage connected to said at least one adjustment capacitor.

\* \* \* \* \*